(12) United States Patent
Standaert et al.

(10) Patent No.: US 10,971,398 B2
(45) Date of Patent: Apr. 6, 2021

(54) COBALT INTERCONNECT STRUCTURE INCLUDING NOBLE METAL LAYER

(71) Applicant: International Business Machines Corporation, Armonk, NY (US)

(72) Inventors: Theodorus E. Standaert, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/171,440

(22) Filed: Oct. 26, 2018

(65) Prior Publication Data

US 2020/0135558 A1 Apr. 30, 2020

(51) Int. Cl.
| | |
|---|---|
| *H01L 23/52* | (2006.01) |
| *H01L 21/768* | (2006.01) |
| *H01L 23/522* | (2006.01) |
| *H01L 23/532* | (2006.01) |

(52) U.S. Cl.
CPC .. *H01L 21/76882* (2013.01); *H01L 21/76828* (2013.01); *H01L 21/76843* (2013.01); *H01L 21/76879* (2013.01); *H01L 23/5226* (2013.01); *H01L 23/53252* (2013.01)

(58) Field of Classification Search
None
See application file for complete search history.

(56) References Cited

U.S. PATENT DOCUMENTS

| | | | |
|---|---|---|---|
| 6,107,687 A | 8/2000 | Fukada et al. | |
| 6,239,494 B1 | 5/2001 | Besser et al. | |
| 6,258,703 B1 | 7/2001 | Cotte et al. | |
| 6,787,446 B2 | 9/2004 | Enomoto et al. | |
| 7,193,327 B2 | 3/2007 | Yu et al. | |
| 7,670,646 B2 | 3/2010 | Ahn et al. | |
| 7,968,462 B1* | 6/2011 | Sun | H01L 21/76868 438/678 |
| 8,711,518 B1* | 4/2014 | Zeng | G11B 5/3163 360/125.03 |
| 9,048,296 B2 | 6/2015 | McFeely et al. | |
| 9,362,377 B1 | 6/2016 | Kim et al. | |
| 9,514,983 B2 | 12/2016 | Jezewski et al. | |
| 9,685,371 B2 | 6/2017 | Zope et al. | |
| 9,716,063 B1 | 7/2017 | Edelstein et al. | |
| 9,741,577 B2 | 8/2017 | Li et al. | |
| 2008/0299772 A1* | 12/2008 | Yoon | H01L 21/76868 438/687 |
| 2009/0263967 A1* | 10/2009 | Kil | H01L 21/76846 438/669 |
| 2010/0295181 A1* | 11/2010 | Yang | H01L 23/53238 257/751 |
| 2012/0252207 A1* | 10/2012 | Lei | H01L 21/76834 438/653 |
| 2014/0299988 A1* | 10/2014 | Cabral, Jr. | H01L 21/76846 257/751 |

(Continued)

*Primary Examiner* — Bilkis Jahan
(74) *Attorney, Agent, or Firm* — Cantor Colburn LLP; James Nock

(57) ABSTRACT

Interconnect structures and processes of fabricating the interconnect structures generally includes partially or completely cobalt filled openings. The cobalt metal is conformally deposited onto a noble metal layer and thermally annealed to reflow the cobalt metal and partially or completely fill the openings.

12 Claims, 4 Drawing Sheets

(56) References Cited

U.S. PATENT DOCUMENTS

| | | |
|---|---|---|
| 2015/0093891 A1 | 4/2015 | Zope et al. |
| 2015/0147880 A1 | 5/2015 | Lee et al. |
| 2015/0179579 A1* | 6/2015 | Jezewski ........... H01L 21/76846 257/753 |
| 2017/0005000 A1* | 1/2017 | Beyne ................. H01L 21/0212 |
| 2017/0084486 A1 | 3/2017 | Zope et al. |
| 2017/0170062 A1 | 6/2017 | Murray et al. |
| 2017/0178956 A1 | 6/2017 | Park et al. |
| 2018/0053725 A1* | 2/2018 | Edelstein ............ H01L 21/3212 |
| 2018/0130706 A1* | 5/2018 | Chen ................. H01L 21/02063 |
| 2018/0151423 A1* | 5/2018 | Jezewski ........... H01L 21/76843 |
| 2018/0174965 A1 | 6/2018 | Kamineni et al. |
| 2019/0074217 A1* | 3/2019 | Jezewski ........... H01L 21/76867 |

* cited by examiner

COBALT INTERCONNECT STRUCTURE INCLUDING NOBLE METAL LAYER

BACKGROUND

The present invention generally relates to semiconductor integrated circuits, and more particularly, to the structure and formation of cobalt containing interconnect structures.

Integrated circuit (IC) devices typically include circuit elements such as transistors, capacitors and resistors formed within or on a semiconductor substrate. Interconnect structures are used to electrically couple or connect the discrete circuit elements into functional circuits. Typical metal interconnects can include a line (trench) portion and a via portion.

Interconnect structures can be fabricated from copper, and typically include a barrier layer such as titanium or tantalum or nitride materials such as tantalum nitride or titanium nitride, or a combination thereof (e.g., tantalum nitride/tantalum (TNT)). A problem with utilizing copper interconnect structures is that they are highly susceptible to electromigration, which can lead to void formation and failure. Moreover, with dimensional scaling, both metal fill capability and reliable of the copper interconnect becomes more and more challenging. Increase of copper resistivity with feature dimension scaling becomes an issue in small features.

SUMMARY

Embodiments of the present invention are generally directed to semiconductor structures including one or more metal interconnect layers and methods of fabrication. A non-limiting example of the metal interconnect structure in accordance with one or more aspects of the invention includes a dielectric layer including one or more openings, wherein the one or more openings exposes a conductive region of an underlying interconnect structure or substrate. A conformal liner layer is provided on the structure and a conformal noble metal layer is on the conformal liner layer, wherein the noble metal includes iridium, ruthenium, or rhodium. A cobalt metal is on the noble metal layer at least partially filling the one or more openings.

A non-limiting example of a process for forming a metal interconnect layer in accordance with one or more aspects of the invention includes lithographically patterning and etching a dielectric layer to form one or more openings, wherein the one or more openings exposes a conductive region of an underlying interconnect structure or substrate. A liner layer is conformally deposited onto the dielectric layer and a noble metal layer is conformally deposited onto the liner layer, wherein the noble metal layer includes iridium, rhodium or ruthenium. One or more layer of cobalt are conformally deposited onto the noble metal layer. The cobalt is reflowed by thermally annealing at a temperature and time effective to at least partially fill the one or more openings.

A non-limiting example of the process for forming an interconnect layers in accordance with one or more aspects of the invention includes lithographically patterning and etching a dielectric layer to form one or more via and/or trench features, wherein the one or more via features exposes a conductive region of an underlying interconnect structure or substrate. A liner layer is conformally deposited onto the dielectric layer, wherein the liner layer includes tantalum, titanium, tungsten, nitrides thereof, or combinations thereof. A noble metal layer is conformally deposited onto the liner layer, wherein the noble metal layer includes iridium, rhodium or ruthenium. One or more layers of cobalt are conformally deposited onto the noble metal layer by chemical vapor deposition or atomic vapor deposition. The cobalt is reflowed by thermally annealing at a temperature within a range of about 200° C. to about 900° C. to partially or completely fill the one or more via and/or trench features.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
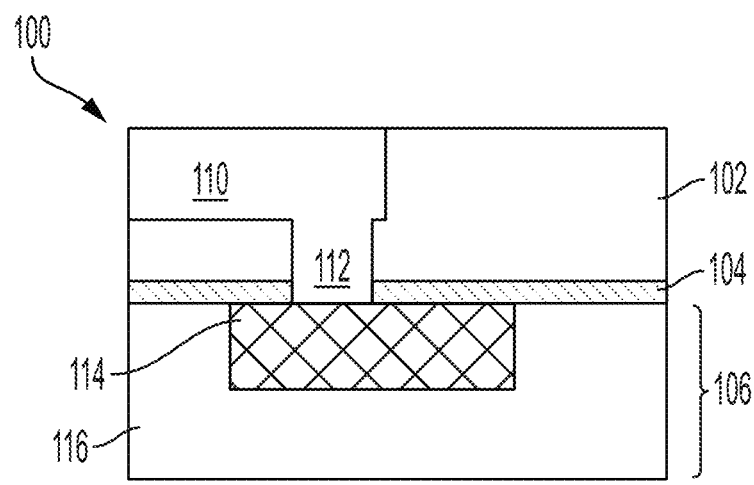
FIG. 1 depicts a cross section of a patterned dielectric layer including one or more openings overlying an interconnect structure in accordance with one or more embodiments of the present invention.

The present invention generally relates to an interconnect structure and process for forming the interconnect structures. The structures and processes generally include integration of cobalt to fill or partially fill the interconnect structure, e.g., provide partially cobalt filled vias, cobalt filled vias, partially cobalt filled trenches, and/or completely cobalt filled trenches, using a metal reflow process. Advantageously, cobalt brings significant benefits to chips and chip making: lower resistance and variability at small dimensions; improved gap fill at very fine dimensions of less than 20 nanometers (nm); and improved reliability. For example, compared to conventional electrochemical plating of copper, the cobalt reflow process of the present invention provides better gap fill capability primarily because seed layers are not required and conformality is not an issue. Moreover, cobalt is reflowed and recrystallized, which eliminates seams and leads to larger grain sizes, which reduces resistivity. Still further, the integration of cobalt reduces and/or eliminates the need for copper electroplating.

Integration of cobalt into the interconnect structure generally includes reflow of the cobalt metal initially on a noble metal liner layer such as iridium, ruthenium, or rhodium, which can then be deposited and reflowed to a desired thickness. Compared to tantalum and titanium, which are commonly used as liner layers for copper interconnects, noble metals such as those described above provide less lattice mismatch when compared to tantalum and titanium. For example cobalt, which has a hexagonal close packed crystalline structure, has lattice constants of 250.71, 250.71 and 406.95 pm whereas ruthenium, for example, has lattice constants of 270.59, 270.59, and 428.15 pm and also has a hexagonal close packed crystalline structure. In contrast, titanium, which has a hexagonal close packed crystalline structure, has lattice constants of 345.66, 345.66 and 552.48 pm. Tantalum, having a body centric cubic crystalline structure, has lattice constants of 330.13, 330.13, and 330.13 pm. Clearly, cobalt has less of a lattice mismatch relative to a noble metal such as ruthenium than traditional liner layers of titanium and tantalum. As will be discussed in greater detail below, minimizing lattice mismatch at the interface with cobalt is important to reflow of the cobalt so as to provide good grain structure.

Detailed embodiments of the integrated circuit including at least one metal interconnect layer and methods for fabricating an integrated circuit including the at least one metal interconnect layer according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Turning now to FIGS. 1-11, schematically illustrated is a process flow for forming an integrated circuit including at least one cobalt containing interconnect layer according to one or more embodiments of the invention. Depending on the intended application, the process can provide an interconnect structure with partially cobalt filled vias, cobalt filled vias, partially cobalt filled trenches, and/or completely cobalt filled trenches. A combination of the above can be provided on as a single chip as can be desired for different applications.

In FIG. 1, there is shown a portion of an integrated circuit 100 including an dielectric layer 102, e.g., an interlayer dielectric, provided on a capping layer 104 overlying an underlying interconnect structure 106 (or substrate). The capping layer 104 is not intended to be limited and can be silicon nitride, silicon oxynitride, or the like. The dielectric layer 102 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer 102 can be deposited by PECVD procedures as is generally known in the art.

An optional hardmask layer (not shown) can be deposited on the interlayer dielectric. The hardmask layer is not intended to be limited and can be, for example, titanium, titanium nitride, silicon nitride, or the like. The can be deposited by PECVD (for silicon nitride and derivatives) or PVD (for titanium nitride) procedures as is generally known in the art.

The interlayer dielectric 102 is lithographically patterned and etched to form one or more openings 108, which includes a trench opening 110 to define a line and a via opening 112. The lithographic process for forming the one or more openings in the interlayer dielectric 102 is not intended to be limited and can include a dual damascene process. For advanced design rule, the process can include deposition of a trilayer including an organic planarizing layer, a silicon antireflective coating layer and a photoresist. The photoresist is sensitive to radiation, e.g., extreme ultraviolet (EUV) radiation, and, depending on the photoresist used, portions of the photoresist that are exposed to the radiation can be removed (or left remaining) by a development process. The one or more openings 108 are then formed in the interlayer dielectric by etching or otherwise modifying the interlayer dielectric in the areas from which the photoresist has been removed. For example, a reactive ion etch process can be used to anisotropically remove portions of the interlayer dielectric layer 102 to form the one or more openings. The particular pattern is not intended to be limited and can include a trench feature, a via feature, combinations thereof, or the like. The via feature exposes a conductor 114 in the underlying interconnect structure (or substrate), which can be embedded within dielectric layer 116.

Figure 2:
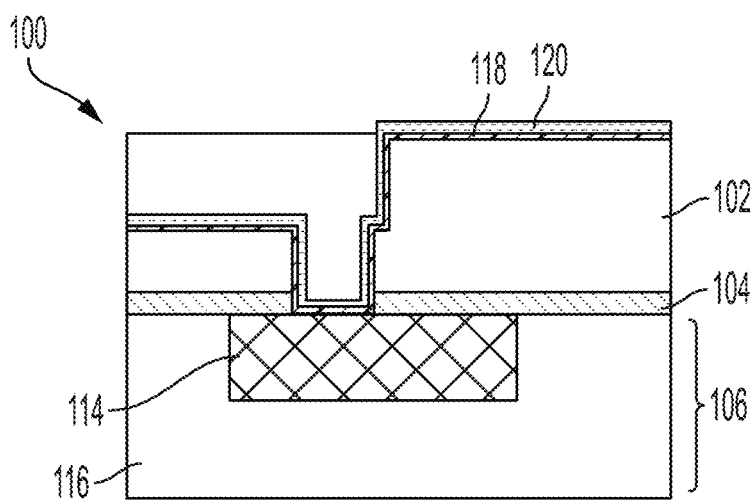
FIG. 2 depicts a cross section of the patterned dielectric layer of FIG. 1 subsequent to conformal deposition of a liner layer and a noble metal layer on the liner layer in accordance with one or more embodiments of the present invention.

In FIG. 2, a liner layer 118 (i.e., diffusion barrier layer) is conformally deposited onto the patterned interlayer dielectric 102. For example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer such as titanium nitride, for example, insures that cobalt, which can participate in interdiffusion during subsequent annealing/reflow processes, will not further diffuse into interlayer dielectric 102. The liner layer 118 can be deposited by PVD, CVD, or ALD processes. Additionally, the liner layer 118 provides adhesion.

A noble metal layer 120 is conformally deposited onto the structure 100. The noble metal can be iridium, ruthenium, or rhodium. The noble metal layer can be deposited by plasma vapor deposition (PVD), chemical vapor deposition (CVD), or atomic layer deposition (ALD) as is known in the art.

Figure 3:
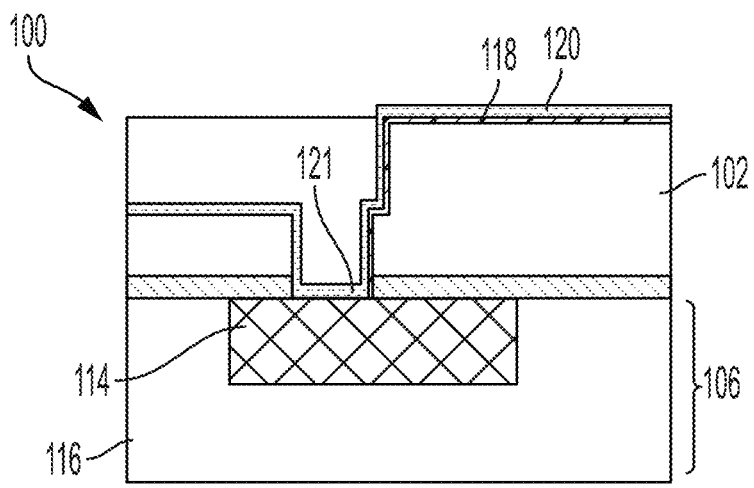
FIG. 3 depicts a cross section of the patterned dielectric layer of FIG. 1 subsequent to conformal deposition of a liner layer and a noble metal layer on the liner layer, wherein the bottom of the via feature is free of the liner layer in accordance with one or more embodiments of the present invention.

Optionally, as shown in FIG. 3, the liner layer 118 is not deposited or is removed from the exposed surface of the conductor 114 in the underlying interconnect structure 106, the bottom of the via 121 is free of the liner layer. The absence of the liner layer on the conductor 114 can lower via resistance in applications where low resistance is desired.

Figure 4:
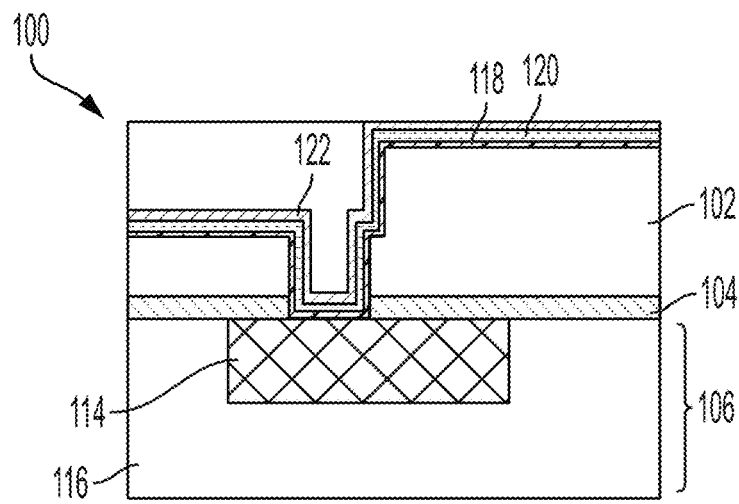
FIG. 4 depicts a cross section of the patterned dielectric layer of FIG. 2 subsequent to conformal deposition of a cobalt metal layer onto the noble metal layer on the liner layer in accordance with one or more embodiments of the present invention.

Referring now to FIG. 4, a conformal layer of cobalt 122 is deposited by chemical vapor deposition of atomic layer deposition. The process can be repeated to provide the desired thickness.

Figure 5:
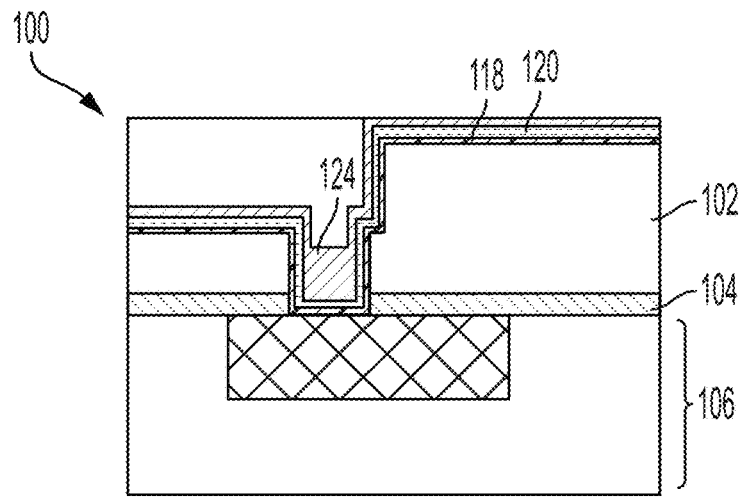
FIG. 5 depicts a cross section of the structure of FIG. 4 subsequent to thermally annealing and reflow of the cobalt metal layer to partially fill the via feature with cobalt in accordance with one or more embodiments of the present invention.

As shown in FIG. 5, the structure 100 is subjected to a thermal reflow process to reflow the CVD or ALD deposited cobalt 122 into the via feature to form a partially cobalt filled via 124. The thermal reflow process includes heating the substrate 100 to The reflow process can help grow larger grain structures within the cobalt layer, decreasing resistivity and expelling impurities from poor grain structures. In one or more embodiments, the reflow process uses gasses such as nitrogen, hydrogen, and argon. Furthermore, the reflow process can be performed at a temperature less than the thermal budget of the backend structures. For example, in one or more embodiments, the reflow process is performed at a temperature from about 200° C. to about 900° C. or more. The reflow process can be a furnace anneal, a rapid thermal anneal (RTA), laser anneal, flash anneal, or any suitable combination of those processes.

In an exemplary application, the reflow conditions of a furnace anneal include a temperature of about 200° C. to about 350° C. for about 10 minutes to about 4 hours. Reflow conditions of a laser anneal include a temperature of about 350° C. to about 900° C. for about 50 nanoseconds to about 5 minutes. However, any suitable annealing process is within the scope of the invention.

In or more embodiments, a cycling technique can optionally be utilized to deposit the cobalt layer 122. One cycle can include deposition of the CVD or ALD deposition of the cobalt metal 122 and one reflow process. The reflow operation of one cycle can be set at a temperature and time duration to briefly reflow the cobalt material to improve step coverage. The deposition operation of one cycle can be a short deposition to deposit less cobalt metal, such that several operations are required to completely fill the via and line openings as desired.

Figure 6:
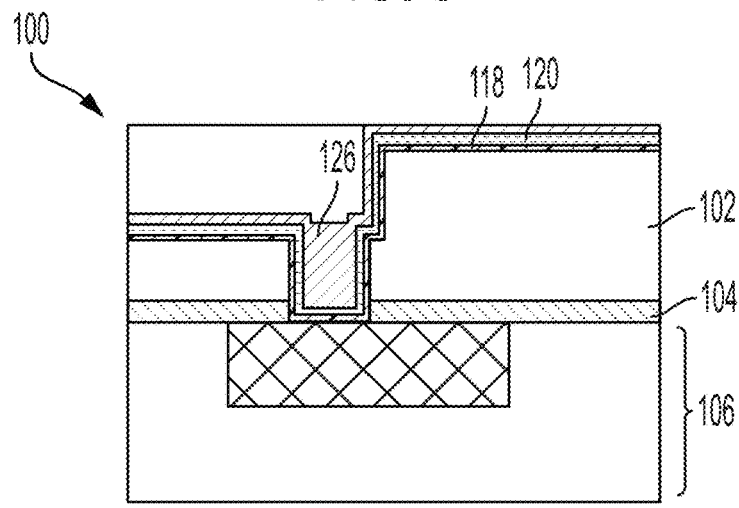
FIG. 6 depicts a cross section of the structure of FIG. 4 subsequent to thermally annealing and reflow of the cobalt metal layer to completely fill the via feature with cobalt in accordance with one or more embodiments of the present invention.

In FIG. 6, the structure 100 is subjected to thermal reflow to reflow the CVD or ALD deposited cobalt 122 to form a completely cobalt filled via 126.

Figure 7:
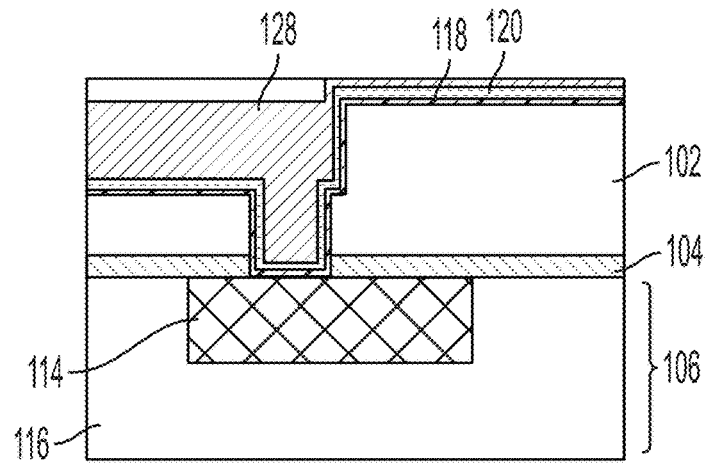
FIG. 7 depicts a cross section of the structure of FIG. 4 subsequent to thermally annealing and reflow of the cobalt metal layer to partially fill the trench feature with cobalt in accordance with one or more embodiments of the present invention.

In FIG. 7, the structure 100 is subjected to thermal reflow to reflow the CVD or ALD deposited cobalt 122 to form a partially filled cobalt trench and completely filled via 128.

Figure 8:
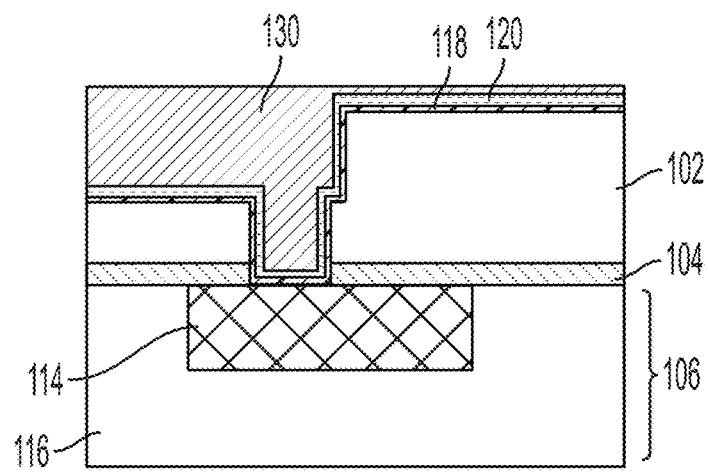
FIG. 8 depicts a cross section of the structure of FIG. 4 subsequent to thermally annealing and reflow of the cobalt metal layer to completely fill the via and trench feature with cobalt in accordance with one or more embodiments of the present invention.

In FIG. 8, the structure 100 is subjected to thermal reflow to reflow the CVD or ALD deposited cobalt 122 to form a completely cobalt filled trench and via 130.

In one or more embodiments, the via feature can be filled or partially filled with a different metal than the completely or partially cobalt filled trench.

Figure 9:
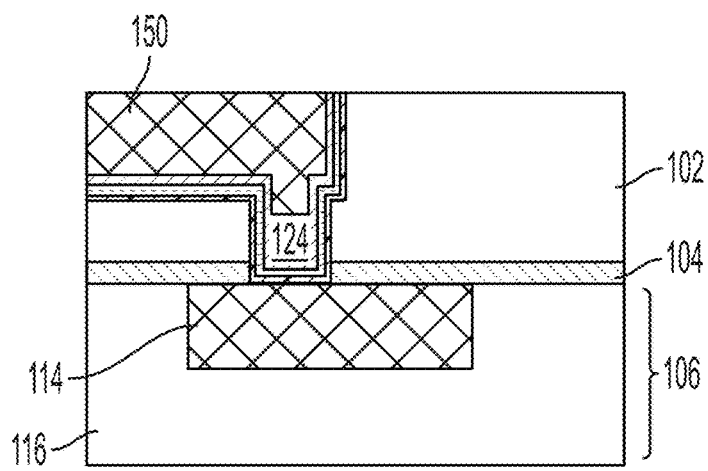
FIG. 9 depicts a cross section of the structure of FIG. 5 subsequent to deposition of a metal into the partially cobalt filled via feature and planarization to the interlayer dielectric in accordance with one or more embodiments of the present invention.
Figure 10:
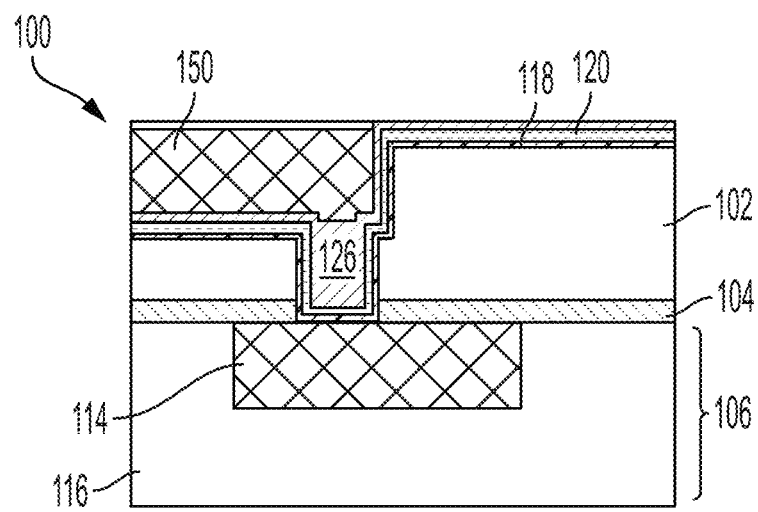
FIG. 10 depicts a cross section of the structure of FIG. 6 subsequent to deposition of a metal into the unfilled trench feature and planarization to the interlayer dielectric in accordance with one or more embodiments of the present invention.
Figure 11:
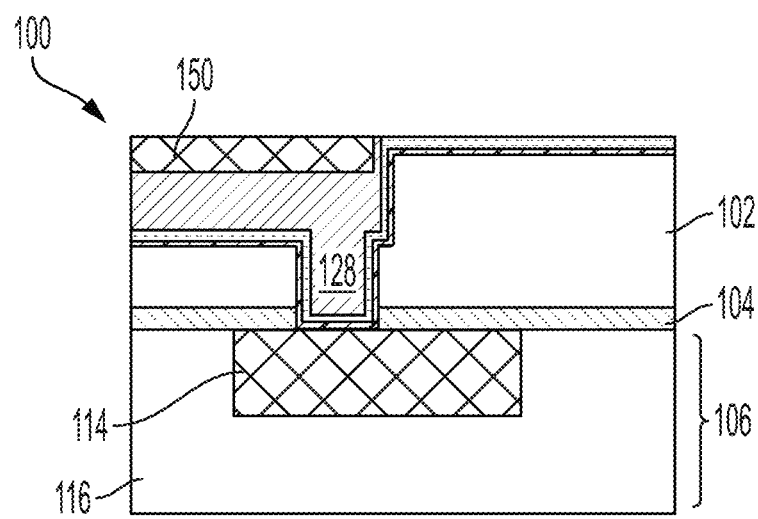
FIG. 11 depicts a cross section of the structure of FIG. 7 subsequent to deposition of a metal into the partially cobalt filled trench feature and planarization to the interlayer dielectric in accordance with one or more embodiments of the present invention; in accordance with one or more embodiments of the present invention.

Referring now to FIGS. 9-11, the partially filled via and/or trench features are filled with a second metal such that the top surface of the trench is coplanar to a top surface of the dielectric 102. As shown in FIG. 9, a second metal 150 such as copper, aluminum, tungsten, nickel, alloys thereof is deposited onto the structure including a partially filled via 124. The second metal can be deposited by an electrochemical deposition process (also referred to as electroplating), e-beam evaporative deposition, physical vapor deposition, chemical vapor deposition, or the like.

As shown in FIG. 10, the second metal 150 such as copper, aluminum, tungsten, nickel, alloys thereof is deposited onto the structure including a partially filled via 126.

As shown in FIG. 11, the second metal 150 such as copper, aluminum, tungsten, nickel, alloys thereof is deposited onto the structure including a partially filled via 128.

It should be apparent that various combinations of cobalt filling can be provided in a single chip. For example, a single chip can include various interconnect structures including a partially cobalt filled via, a completely cobalt filled via, a partially cobalt filled trench, and/or a completely cobalt filled trench. Likewise, the interface between the via and the underlying conductor can include barrier layer 118 or can be free of the barrier layer 118.

Following formation of the second metal layer, the substrate can be subjected to a planarization process to remove any metal overburden such that a top surface of the metal is substantially coplanar to the low k dielectric layer as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A process for forming a metal interconnect layer, the process comprising:
lithographically patterning and etching a dielectric layer to form one or more openings, wherein the one or more openings exposes a conductive region of an underlying interconnect structure or substrate;
conformally depositing a liner layer;
conformally depositing a noble metal layer onto the liner layer, wherein the noble metal layer comprises iridium or rhodium;
conformally depositing one or more layers of cobalt onto the noble metal layer; and
thermally annealing at a temperature and time effective to reflow the cobalt to at least partially fill the one or more openings to form one or more partially cobalt filled openings;
wherein the conformally deposited noble metal layer partially fills the one or more openings and exposing side surfaces.

2. The process of claim 1 further comprising filling the one or more partially cobalt filled openings with a metal comprising copper, aluminum, tungsten, nickel or alloys thereof.

3. The process of claim 1, wherein conformally depositing the one or more layers of cobalt comprises a chemical vapor deposition process or an atomic layer deposition process.

4. The process of claim 1, wherein the conformal liner layer comprises titanium, tantalum, tungsten, nitrides thereof or combinations thereof.

5. The process of claim 1, wherein the dielectric layer comprises $SiO_2$, silsesquioxanes, carbon doped oxides that include atoms of Si, C, O and H, thermosetting polyarylene ethers, or multilayers thereof.

6. The process of claim 1, wherein the one or more openings in the metal interconnect layer comprises a via and a trench, wherein the metal interconnect layer comprises partially cobalt filled vias, completely cobalt filled vias, partially cobalt filled trenches and/or completely cobalt filled vias and trenches.

7. The process of claim 1 further comprising removing the liner layer from the exposed conductive region of the underlying interconnect structure or substrate subsequent to conformally depositing the liner layer.

8. The process of claim 6 further comprising depositing copper, aluminum, nickel tungsten or alloys thereof into unfilled or partially cobalt filled vias and trenches.

9. The process of claim 1, wherein the temperature is from about 200° C. to about 900° C.

10. The process of claim 1, wherein thermally annealing comprises furnace annealing at the temperature within a range of about 200° C. to about 350° C. for the time within the range of about 10 minutes to about 4 hours.

11. The process of claim 1, wherein thermally annealing comprises laser annealing at the temperature within a range of about 350° C. to about 900° C. for the time within the range of about 50 nanoseconds to about 5 minutes.

12. The process of claim 1, wherein the conformally deposited cobalt coats the inner sidewalls and the base of the noble metal layer.

* * * * *